(12) United States Patent
Payrard et al.

(10) Patent No.: US 7,336,110 B1
(45) Date of Patent: Feb. 26, 2008

(54) DIFFERENTIAL AMPLITUDE CONTROLLED SAWTOOTH GENERATOR

(75) Inventors: Daniel Payrard, St. Maximin (FR); Michel Cuenca, Septemes les Vallons (FR); Eric Brunet, Pourrieres (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/624,139

(22) Filed: Jan. 17, 2007

(51) Int. Cl.
*H03K 4/06* (2006.01)

(52) U.S. Cl. ............... 327/131; 327/140; 327/148; 327/155; 327/157; 331/25; 375/374; 455/260

(58) Field of Classification Search ............... 327/131, 327/132, 137, 140, 144, 147, 148, 336, 155–157, 327/355, 358; 331/8, 11, 25, 34; 375/373–376; 455/260, 262

See application file for complete search history.

(56) References Cited

U.S. PATENT DOCUMENTS

| | | | | |
|---|---|---|---|---|
| 4,041,405 A | * | 8/1977 | Davis | ............... 327/140 |
| 4,284,906 A | | 8/1981 | Manfredi | |
| 5,121,085 A | * | 6/1992 | Brown | ............... 331/8 |
| 5,943,382 A | * | 8/1999 | Li et al. | ............... 375/376 |
| 6,127,896 A | | 10/2000 | Burzio | |
| 6,885,331 B2 | | 4/2005 | Krymski | |
| 6,954,511 B2 | * | 10/2005 | Tachimori | ............... 375/376 |
| 7,075,470 B2 | | 7/2006 | Lee | |
| 7,088,962 B2 | | 8/2006 | Anand et al. | |
| 2005/0013343 A1 | * | 1/2005 | Giunco et al. | ............... 375/130 |
| 2006/0176933 A1 | * | 8/2006 | Uemura et al. | ............... 375/130 |

FOREIGN PATENT DOCUMENTS

WO WO2004062104 A2 7/2004

* cited by examiner

*Primary Examiner*—Haissa Philogene
(74) *Attorney, Agent, or Firm*—Schneck & Schneck; Thomas Schneck

(57) ABSTRACT

A dual differential sawtooth signal generator includes a first sawtooth voltage generator that has a first capacitor and a second capacitor that are alternately charged with a feedback control source current from a low voltage reference voltage level. A second sawtooth voltage generator has a first discharge capacitor and a second discharge capacitor that are alternately discharged with a feedback control sink current from a high voltage reference voltage level. The output signals of the two sawtooth voltage generators are compared to control a phase frequency comparator that provides signals to control a dual charge pump that provides the feedback control source current and that provides the feedback control sink current.

23 Claims, 8 Drawing Sheets

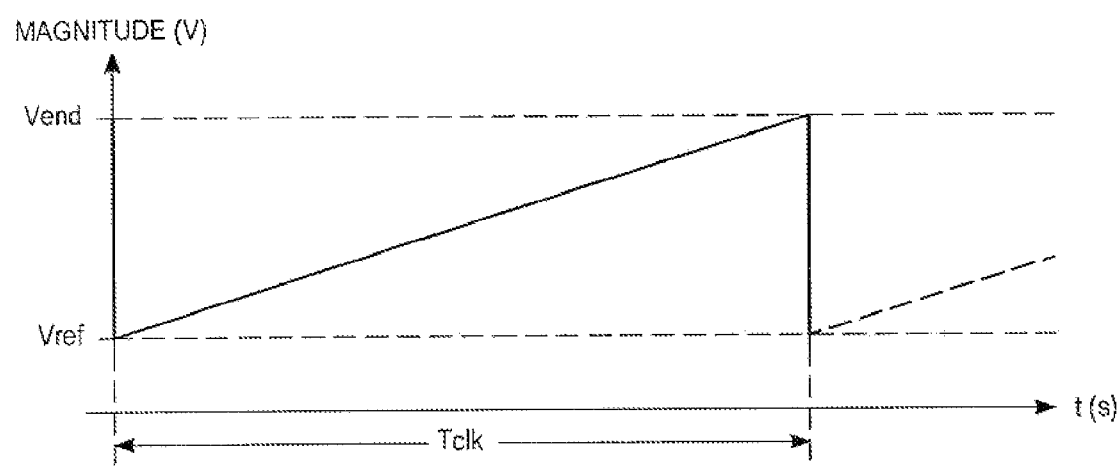
Fig._1

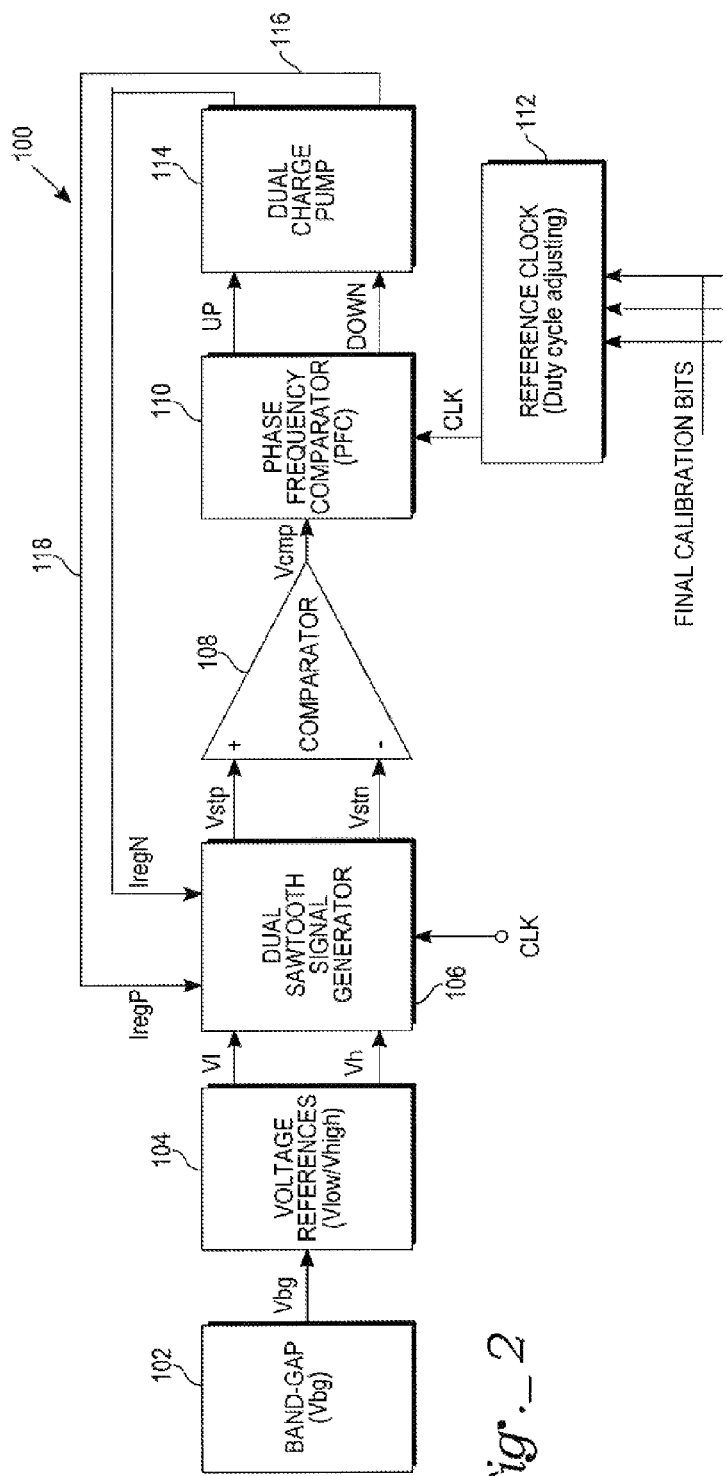
_Fig._ _2_
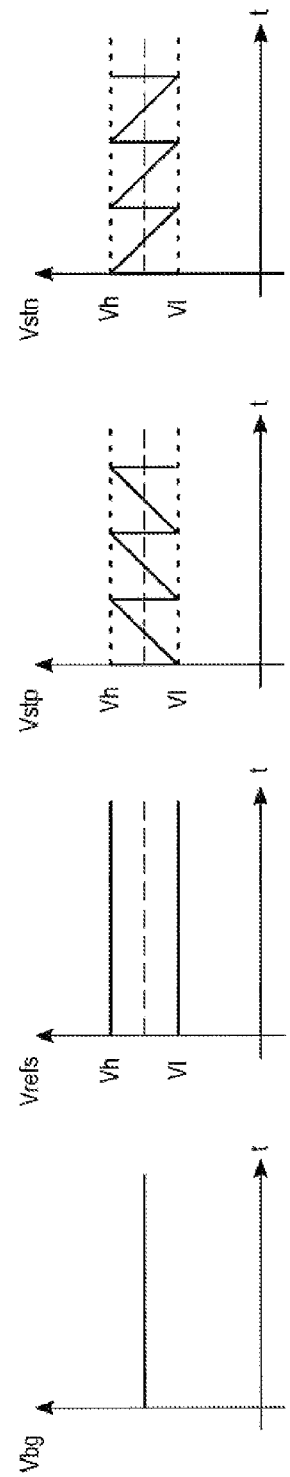
_Fig._ _6_
_Fig._ _5_
_Fig._ _4_
_Fig._ _3_

DIFFERENTIAL AMPLITUDE CONTROLLED SAWTOOTH GENERATOR

TECHNICAL FIELD

This invention relates to a sawtooth signal generator that provides a differentially controlled sawtooth signal amplitude.

BACKGROUND

FIG. 1 shows a waveform for a sawtooth signal that is generated by charging a capacitor with a constant current source. The magnitude (M) of the sawtooth signal generated by having a charging current (I) charge a capacitor (C) is given by:

$$M = Vend - Vref = \frac{I * Tclk}{C},$$

where Tclk is the period of the sawtooth signal, Vref is the starting voltage, and Vend is the ending voltage of the sawtooth signal. The charging current (I) can be provided by a band-gap voltage (Vbg) and a resistor (R). The charging current for charging the capacitor (C) is given by: I=Vbg/R so that the magnitude of the sawtooth can be written as $$M = \frac{Vbg * Tclk}{R * C}.$$

Variations in the values of fabricated resistors have a range of plus and minus 30 percent, while variations in fabricated capacitors have a range of plus and minus 20 percent, depending on fabrication process variations. Thus, the magnitude of a sawtooth signal can vary over a range of minus 36 percent to plus 78 percent. This range for the magnitude, or amplitude, of a sawtooth signal is not acceptable for a system requiring a high level of accuracy. Consequently, a simple charging circuit for a sawtooth generator requires trimming to adjust the magnitude of the sawtooth signal to a desired value. Consequently, a sawtooth generator is required which can provide a sawtooth output signal having a magnitude that is accurate in spite of process variations in component values.

SUMMARY OF THE INVENTION

A dual differential sawtooth signal generator includes a first sawtooth voltage generator having a first charge capacitor and configured to provide a positive going sawtooth output signal. The sawtooth generator also includes a second sawtooth voltage generator having a first discharge capacitor and is configured to provide a negative going sawtooth output signal. A comparator is configured to compare the positive going sawtooth output signal with the negative going sawtooth output signal and to provide a comparator output signal. A phase frequency comparator is configured in response to the comparator output signal to provide signals to control a dual charge pump. The dual charge pump is configured to provide a feedback control source current to the positive going sawtooth generator for controlling the magnitude of the positive going sawtooth output signal and that is also configured to provide a feedback control sink current to the negative going sawtooth generator for controlling the magnitude of the negative going sawtooth output signal. The magnitudes of the feedback control source current and the feedback control sink current have the same absolute value.

A dual output differential sawtooth generator includes a dual-capacitor positive going sawtooth voltage generator circuit that is configured to provide a positive going sawtooth output signal. A dual-capacitor negative going sawtooth voltage generator circuit is configured to provide a negative going sawtooth output signal. A comparator circuit is configured to compare the positive going sawtooth output signal with the negative going sawtooth output signal and to provide a comparator output signal. A phase frequency comparator, in response to the comparator output signal, is configured to provide signals to control a dual charge pump. The dual charge pump is configured to provide a feedback source current to the positive going sawtooth generator for controlling the magnitude of the positive going sawtooth output signal. The dual charge pump is also configured to provide a feedback sink current to the negative going sawtooth generator for controlling the magnitude of the negative going sawtooth output signal. The feedback source current and the feedback sink current from the dual charge pump have the same absolute value.

A method of generating dual differential sawtooth signals comprises the steps of: controlling the amplitude of a positive going sawtooth output signal by charging a charge capacitor in a positive going sawtooth voltage generator with a variable feedback control source current; controlling the amplitude of a negative going sawtooth output signal by charging a charge capacitor in a negative going sawtooth voltage generator with a variable feedback control sink current; comparing the first positive going sawtooth output signal with the second negative going sawtobth output signal to provide a comparator output signal; and controlling with the comparator output signal a dual charge pump that provides a feedback source current to the positive going sawtooth generator for controlling a magnitude of the positive going sawtooth output signal and that also provides a feedback sink current to the negative going sawtooth generator for controlling the magnitude of the negative going sawtooth output signal such that the feedback source current and the feedback sink current from the dual charge pump have the same absolute value.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a waveform for a sawtooth signal.

FIG. 2 is a block diagram of a differential amplitude controlled sawtooth generator according to the present invention.

FIG. 3 is a waveform diagram showing a band gap reference voltage Vbg.

FIG. 4 is a waveform diagram showing voltage reference levels for a high voltage Vh level and a low voltage Vl level for the differential amplitude controlled sawtooth generator of FIG. 2.

FIG. 5 is a waveform diagram showing a positive going sawtooth voltage waveform Vstp for the differential amplitude controlled sawtooth generator of FIG. 2.

FIG. 6 is a waveform diagram showing a negative going sawtooth voltage waveform Vstn for the differential amplitude controlled sawtooth generator of FIG. 2.

DETAILED DESCRIPTION

Figure 7:
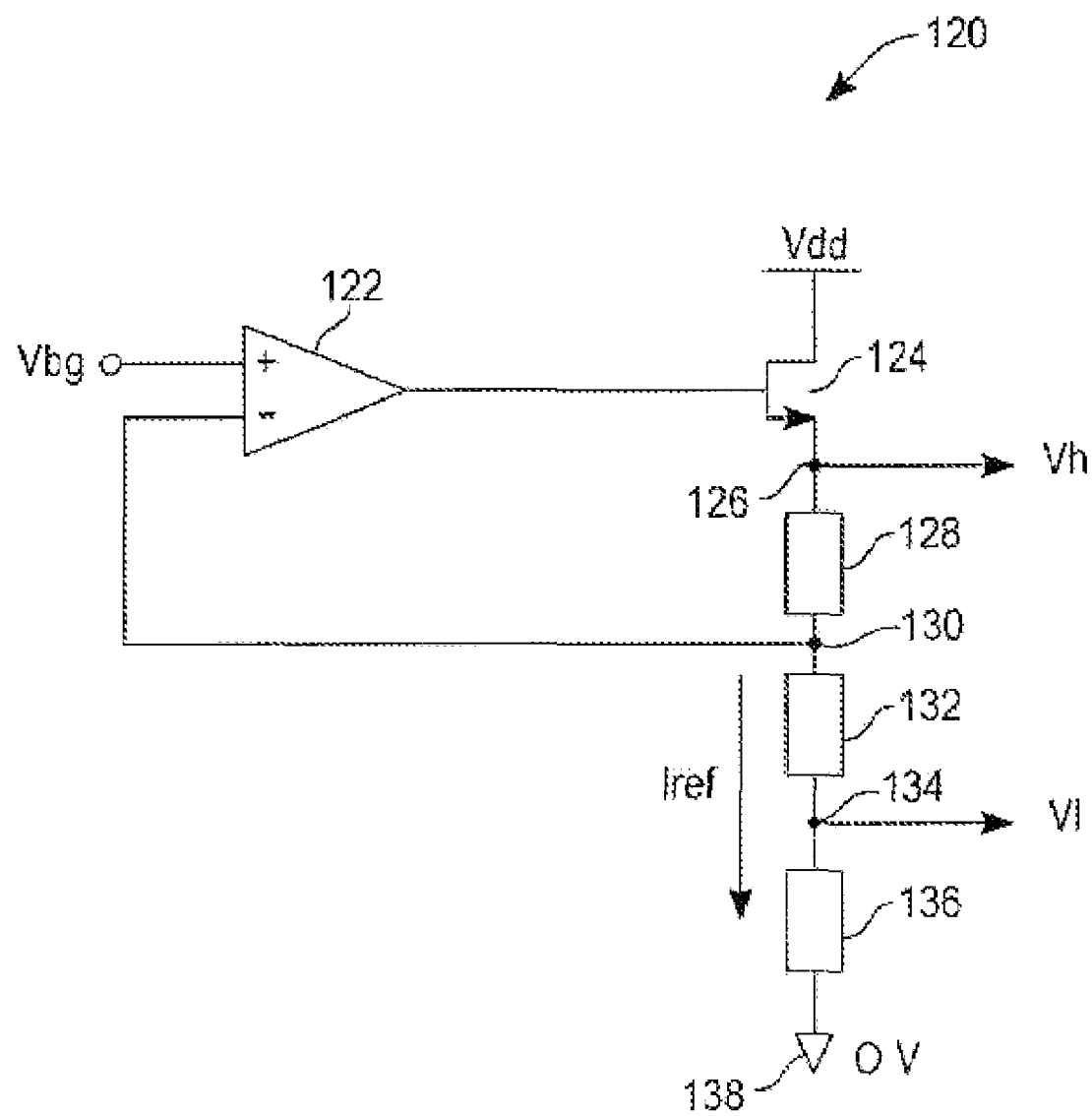
FIG. 7 is a circuit diagram of a voltage reference block that provides from the band gap reference voltage a high voltage Vh level and a low voltage Vl for the differential amplitude controlled sawtooth generator of FIG. 2.

FIG. 2 illustrates an exemplary embodiment of a dual sawtooth signal generator system 100. The sawtooth signal generator system 100 is controlled by comparing a positive going sawtooth signal with a negative going sawtooth signal. A voltage reference circuit 102, such as a bandgap source, provides, for example, a bandgap voltage Vbg as an input reference voltage to a voltage reference circuit 104. The voltage reference circuit 104 provides a high voltage Vh reference voltage and a low voltage Vl reference voltage to a dual sawtooth signal generator 106.

The dual sawtooth signal generator 106 contains two sawtooth signal generators. The dual sawtooth signal generator 106 receives a CLK signal. One positive going sawtooth generator is controlled by a feedback current signal IregP and provides a positive going sawtooth output signal Vstp. The other negative going sawtooth generator is controlled by a feedback current signal IregN and provides a negative going sawtooth output signal Vstn.

A positive input terminal of a voltage comparator 108 receives the positive going sawtooth output signal Vstp. A negative input terminal of the comparator 108 receives the negative going sawtooth output signal Vstn. The comparator 108 provides a comparator output signal Vcmp as one input to a phase frequency comparator (PFC) 110 that compares the comparator output signal Vcmp with the falling edge of a reference CLK output signal from a reference clock circuit 112. As discussed herein below in connection with FIG. 10, an embodiment of the PFC 112 is implemented as a state machine. The clock circuit 112 includes final calibration bits for adjusting the CLK duty cycle, which is used to adjust the amplitude of the sawtooth signals. To provide for adjusting the CLK clock duty cycle, the reference clock circuit 12 is provided with an input clock reference signal having a frequency Fin which equals, for example, k times the clock signal CLK frequency, where k is an integer. As an illustrative example, the CLK signal is provided by using a counter to count, for example, a number (less than k) of rising edges or a number (less than 2k) of rising and falling edges of the input clock reference signal. For example, if k=10, counting rising edges provides adjustment of the duty cycle of the CLK signal in 10% increments of the CLK period. Similarly, if k=20, counting rising and falling edges provides for adjustments of the duty cycle of the CLK signal in 5% increments of the CLK period. For each period of the CLK signal, the PFC 110 provides an UP output signal, a DOWN output signal, or neither to a dual charge pump circuit 114.

The dual charge pump circuit 114 provides on a signal line 116 the feedback current signal IregP to the positive going sawtooth signal generator in the dual sawtooth signal generator 106. The dual charge pump circuit 114 also provides on a signal line 118 the feedback current signal IregN to the negative going sawtooth signal generator in the dual sawtooth signal generator 106.

A first current feedback loop is formed by the positive going sawtooth signal generator, the voltage comparator 108, the PFC 110, and the charge pump of the dual charge pump circuit 114 that provides the feedback current signal IregP to the positive going sawtooth signal generator to regulate the amplitude of the positive going sawtooth signal Vstp from the positive going sawtooth signal generator. Similarly, a second current feedback loop is formed by the negative going sawtooth signal generator, the voltage comparator 108, the PFC 110, and the charge pump of the dual charge pump circuit 114 that provides the feedback current signal IregN to the negative going sawtooth signal generator to regulate the amplitude of the negative going sawtooth signal Vstn from the negative going sawtooth signal generator.

FIG. 3 shows the band gap voltage Vbg level from the voltage reference circuit 102 as an input reference voltage to the voltage reference circuit 104. FIG. 4 illustrates that the voltage reference circuit 104 provides a high voltage Vh reference voltage and a low voltage Vl reference voltage to the dual sawtooth signal generator FIG. 5 illustrates a positive going sawtooth voltage waveform Vstp output signal from the positive going sawtooth generator of the differential amplitude controlled sawtooth generator of FIG. 2. The low voltage Vl reference voltage is the starting level for the positive going sawtooth voltage waveform Vstp. The high voltage Vh reference voltage is the end point for the positive going sawtooth voltage waveform Vstp.

FIG. 6 illustrates a negative going sawtooth voltage waveform Vstn output signal from the negative going sawtooth generator of the differential amplitude controlled sawtooth generator of FIG. 2. The high voltage Vh reference voltage is the starting level for the negative going sawtooth voltage waveform Vstn. The low voltage Vl reference voltage is the end point for the negative going sawtooth voltage waveform Vstn.

FIG. 7 is a circuit diagram for a voltage reference circuit 120 that provides the high voltage Vh level and the low voltage Vl for the two saw tooth generators of the differential amplitude controlled dual sawtooth generator 106 of FIG. 2. The voltage references circuit 120 includes an op amp 122 that has an output terminal coupled to a gate terminal of a NMOS transistor 124. The NMOS transistor 124 has a drain terminal coupled to a Vdd voltage reference and a source terminal coupled to a Vh node 126 at which is provided the Vh reference voltage. The Vh node 126 is coupled through a resistor 128 to a node 130 that is coupled to an inverting input terminal of the op amp 122. A non-inverting input terminal of the op amp 122 receives the Vbg reference voltage. The node 130 is coupled to through a resistor 132 to a Vl node 134, at which is provided the Vl reference signal. The Vl node 134 is coupled through a resistor 136 to a ground, or 0 volt, reference terminal 138. The Vl voltage is a function of the resistors 132, 136 and the bandgap voltage Vbg. The Vh voltage is a function of the resistors 128, 132, 136. For good matching of the resistors, the magnitude of the sawtooth signal (Vh-Vl) depends on the accuracy of the bandgap voltage Vbg.

Figure 8:
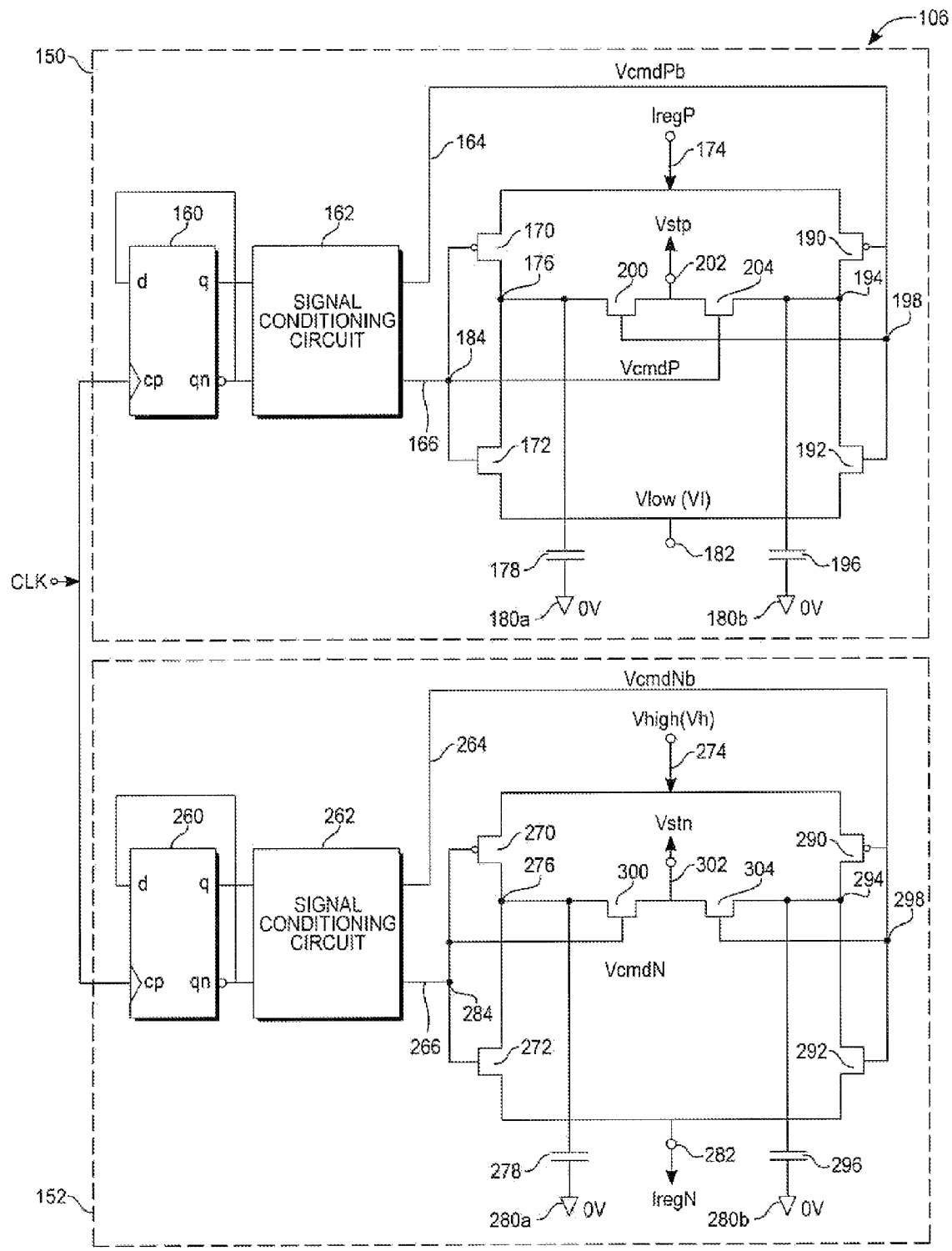
FIG. 8 is a circuit diagram of a two sawtooth voltage generators for the differential amplitude controlled sawtooth generator of FIG. 2.
Figure 9:
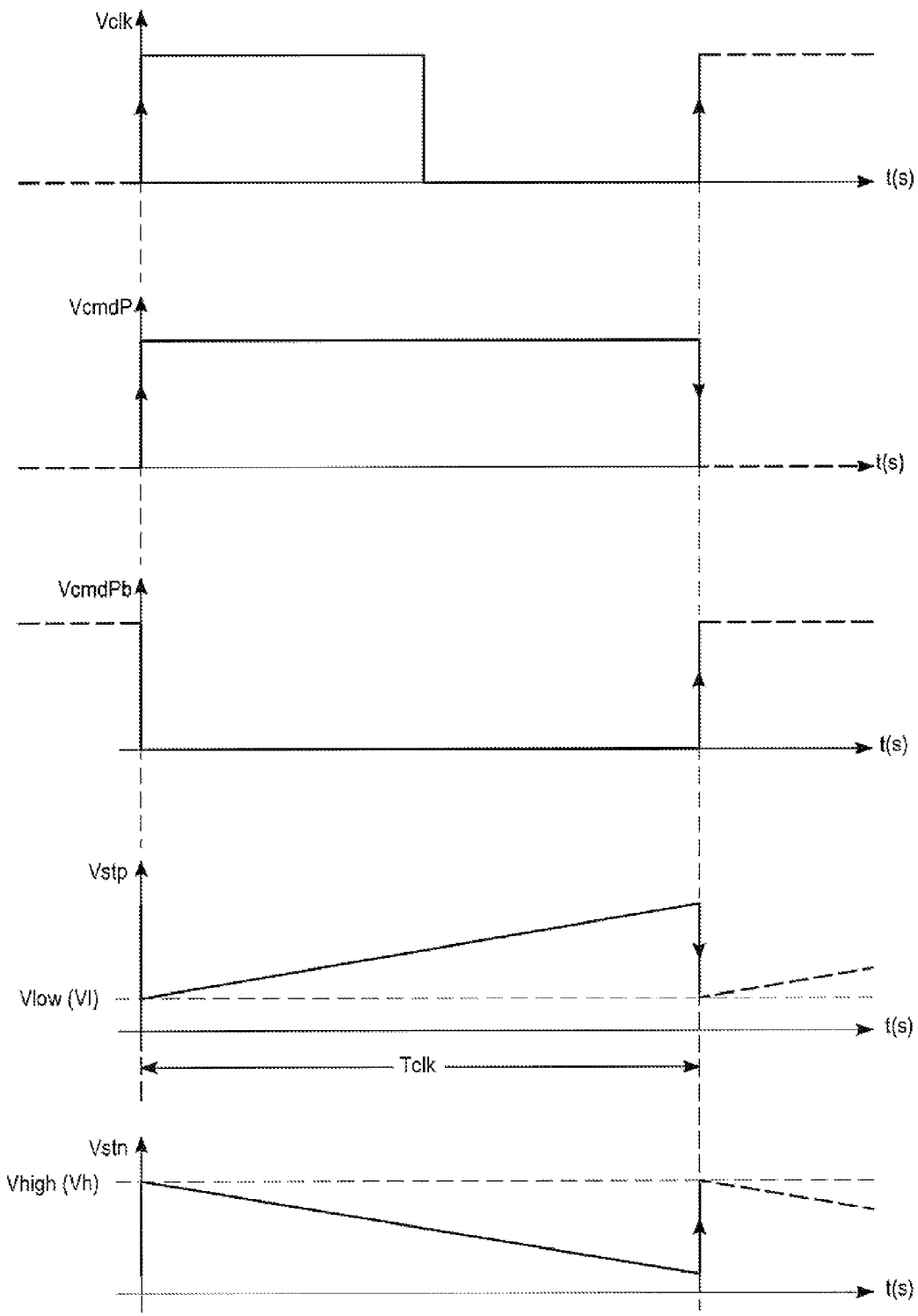
FIG. 9 is a timing diagram showing various voltage waveforms for the two sawtooth voltage generators of FIG. 7.

FIG. 8 is a circuit diagrams for two sawtooth voltage generators 150, 152 contained in the dual sawtooth signal generator 106 of FIG. 2. The sawtooth voltage generator 150 provides a positive going, or rising, sawtooth signal. The sawtooth voltage generator 152 provides a negative going, or falling, sawtooth signal. FIG. 9 shows a timing diagram for various voltage waveforms for the two sawtooth voltage generators of FIG. 2. FIG. 8 and FIG. 9 provide a description of the structure and operation of the two sawtooth generators for the dual sawtooth signal generator 106 of FIG. 2.

The positive going, or rising, sawtooth generator circuit 150 of FIG. 8 generates the positive going, or rising, sawtooth signal Vstp as a sawtooth of increasing voltage that is started by a rising edge of the clock signal CLK and that is reset by the next rising edge of the clock signal CLK. With reference to FIG. 5, the positive going sawtooth signal Vstp starts at the Vl voltage and rises to a peak voltage of Vh.

The positive going sawtooth generation circuit 150 includes an edge-triggered D flip-flop circuit 160 for the positive going sawtooth generator circuit 150. The edge-triggered D flip-flop circuit 160 has a clock terminal cp for receiving the CLK signal, which is substantially a square wave with a period of Tclk. An inverted Q-output terminal qn of the D flip-flop 160 is coupled back to a D-input terminal d. The D flip-flop circuit 160 changes state at the rising edge of the CLK signal in every Tclk time period as shown in FIG. 9. The Q-output signal and the inverted Q-output signal of the D flip-flop 160 are passed through a signal conditioning circuit 162 that prevents the Q-output signal and the inverted Q-output signal from overlapping. The conditioned output signals of the signal conditioning circuit 162 are coupled to the positive going sawtooth generation circuit 150. These signals are a command VcmdP signal provided on a signal line 166 and an inverted command VcmdPb provided on signal line 164. These signals are oppositely phased substantially square wave signals that each have a period of 2Tclk. The VcmdP and VcmdPb signals control operation of the positive going sawtooth generation circuit 150.

The positive going sawtooth generation circuit 150 includes a first CMOS inverter formed with a first PMOS pull-up transistor 170 and a first pull-down NMOS transistor 172. The first PMOS pull-up transistor 170 has a source terminal coupled to an input terminal 174 that receives the feedback current IregP from the charge pump circuit 114 in FIG. 2. The gate terminals of the transistors 170 and 172 are coupled together. The drain terminals of the transistors 170 and 172 are both coupled to a node 176. A first sawtooth capacitor 178 is coupled between the node 176 and a ground terminal 180a. The source terminal of the first pull-down NMOS transistor 172 is coupled to a terminal 182 at which is provided the low voltage Vl. The gate terminals of the transistors 170 and 172 are coupled to a first gate node 184 that receives the VcmdP signal on the signal line 166.

The positive going sawtooth generation circuit 150 also includes a second CMOS inverter formed with a second PMOS pull-up transistor 190 and a second pull-down NMOS transistor 192. The second PMOS pull-up transistor 190 has a source terminal that is also coupled to the input terminal 174 that receives the feedback current IregP from the charge pump circuit 114 in FIG. 2. The gate terminals and the drain terminals of the transistors 190 and 192 are coupled together. The drain terminals of the transistors 190 and 192 are both coupled to a node 194. A second sawtooth capacitor 196 is coupled between the node 194 and a ground terminal 180b. The source terminal of the second pull-down NMOS transistor 192 is coupled to the terminal 182 at which is provided the low voltage Vl. The gate terminals of the transistors 190 and 192 are coupled to a second gate node 198 that receives the command VcmdPb signal on the signal line 164.

A first NMOS coupling transistor 200 is coupled between the node 176 and a Vstp signal output node 202. A gate terminal of the first NMOS coupling transistor 200 is coupled to the second gate node 198 that receives the command VcmdPb signal on the signal line 164. Similarly, a second NMOS coupling transistor 204 is coupled between the node 194 and the Vstp signal output node 202. A gate terminal of the second NMOS coupling transistor 204 is coupled to the first gate node 184 that receives the command VcmdPb signal on the signal line 166.

In operation, the positive going sawtooth generator circuit 150 has the oppositely phased timing command signals VcmdP and VcmdPb provided alternately in phase from the signal conditioning circuit 162, as indicated in the timing diagram of FIG. 9. The positive going sawtooth signal generator 150 receives the current signal IregP from the charge pump 116. The positive going sawtooth signal generator 150 alternately directs the current signal IregP to alternately charge one of the sawtooth capacitors 178, 196, while the other one of the sawtooth capacitors 178, 196 is discharged to the Vl voltage level at terminal 182. A HIGH level of the command VcmdPb signal on signal line 164 turns on the second NMOS pull-down transistor 192 to couple the second sawtooth capacitor 196 to the Vl voltage at the Vl terminal 182 to thereby provide a path to discharge the second sawtooth capacitor 196 to the Vl voltage level. A HIGH level of the VcmdPb signal on signal line 164 also turns on the first NMOS coupling transistor 200 to couple the NODE 176 and the sawtooth capacitor 178 to the Vstp output terminal 202. A corresponding LOW level of the VcmdPb signal on line 164 turns on the first pull-up PMOS transistor 170, which couples the IregP current at terminal 174 to node 176 to charge the first sawtooth capacitor 178 with the IregP current.

Alternately, a HIGH level of the VcmdP signal on signal line 166 turns on the first NMOS pull-down transistor 172 to couple the first sawtooth capacitor 178 to the Vl voltage at the Vl terminal 182 and to discharge the first sawtooth capacitor 178 to the Vl voltage level. A HIGH level of the VcmdP signal on signal line 166 also turns on the second NMOS coupling transistor 204 to couple the node 194 and the sawtooth capacitor 196 to the Vstp output terminal 202. A corresponding LOW level of the VcmdPb signal on line 164 turns on the second pull-up PMOS transistor 190, which couples the IregP current at terminal 174 to node 194 to charge the second sawtooth capacitor 196 with the IregP current.

FIG. 9 illustrates various voltage waveforms for the reference clock signal CLK. The CLK signal is a square wave with a period Tclk. The rising edge of CLK triggers the oppositely phased VcmdP and VcmdPb signals. These two oppositely phased signals alternately charge and discharge the two sawtooth capacitors 178, 196 to produce at a terminal 202 the positive going, or rising, sawtooth voltage Vstp, which starts at the Vl voltage level.

FIG. 8 also illustrates a circuit diagram for the negative going sawtooth voltage generators 152 that has a circuit configuration similar to the positive going sawtooth voltage generator 150. The negative going, or falling, sawtooth generator circuit 152 of FIG. 8 generates the negative going, or falling, sawtooth signal Vstn as a sawtooth of decreasing voltage that is started by a rising edge of the clock signal CLK and that is reset by the next rising edge of the clock signal CLK. With reference to FIG. 5, the negative going sawtooth signal Vstn starts at the Vh voltage and falls to a low voltage Vl level.

The negative going sawtooth generation circuit 152 includes another edge-triggered D flip-flop circuit 260 that has a clock terminal cp for receiving the CLK signal. An inverted Q-output terminal qn of the D flip-flop 260 is coupled back to a D-input terminal d. The D flip-flop circuit 260 changes state at the rising edge of the CLK signal in every Tclk time period as shown in FIG. 9. The Q-output signal and the inverted Q-output signal of the D flip-flop 260 are passed through a signal conditioning circuit 262 that prevents the Q-output signal and the inverted Q-output signal from overlapping. The conditioned output signals of the signal conditioning circuit 262 are coupled to the negative going sawtooth generation circuit 152. These signals are a command VcmdN signal provided on a signal line 266 and an inverted command VcmdNb signal. These signals are oppositely phased substantially square wave signals that each have a period of 2Tclk. The VcmdN and VcmdNb signals control operation of the negative going sawtooth generation circuit 152.

The negative going sawtooth generation circuit 152 includes a third CMOS inverter formed with a third PMOS pull-up transistor 270 and a third pull-down NMOS transistor 272. The third PMOS pull-up transistor 270 has a source terminal coupled to an input terminal 274 that receives the Vh-reference voltage. The gate terminals of the transistors 270 and 272 are coupled together. The drain terminals of the transistors 270 and 272 are both coupled to a node 276. A third sawtooth capacitor 278 is coupled between the node 276 and a ground terminal 280a. The source terminal of the third pull-down NMOS transistor 272 is coupled to a terminal 282 at which is provided the IregN current from the charge pump 114 of FIG. 2. The gate terminals of the transistors 270 and 272 are coupled to a third gate node 284 that receives the command VcmdN signal on the signal line 266.

The negative going sawtooth generation circuit 152 also includes a fourth CMOS inverter formed with a fourth PMOS pull-up transistor 290 and a fourth pull-down NMOS transistor 292. The fourth PMOS pull-up transistor 290 has a source terminal that is also coupled to the input terminal 274 that receives the Vh reference voltage. The gate terminals and the drain terminals of the transistors 290 and 292 are coupled together. The drain terminals of the transistors 290 and 292 are both coupled to a node 294. A fourth sawtooth capacitor 296 is coupled between the node 294 and a ground terminal 280b. The source terminal of the fourth pull-down NMOS transistor 292 is coupled to the terminal 282 at which is provided the IregN current. The gate terminals of the transistors 290 and 292 are coupled to a fourth gate node 298 that receives the command VcmdNb signal on the signal line 264.

A third NMOS coupling transistor 300 is coupled between the node 276 and a Vstn signal output node 302. A gate terminal of the third NMOS coupling transistor 300 is coupled to the third gate node 284 that receives the command VcmdN signal on the signal line 266. Similarly, a fourth NMOS coupling transistor 304 is coupled between the node 294 and the Vstn signal output node 302. A gate terminal of the fourth NMOS coupling transistor 304 is coupled to the fourth gate node 298 that receives the command VcmdNb signal on the signal line 264.

In operation, the negative going sawtooth generator circuit 152 has the oppositely phased timing command signals VcmdN and VcmdNb provided alternately in phase from the signal conditioning circuit 262. These signals are not shown in FIG. 9 and are similar to the VcmdP and, VcmdPb signals of FIG. 9. The negative going sawtooth signal generator 152 receives the current signal IregN at terminal 282 from the charge pump 116 of FIG. 2. The negative going sawtooth signal generator 152 alternately directs the feedback current signal IregN to alternately discharge one of the sawtooth capacitors 278, 296, while the other one of the sawtooth capacitors 278, 296 is charged to the Vh voltage level at terminal 274.

A HIGH level of the command VcmdNb signal on signal line 264 turns on the fourth NMOS pull-down transistor 292 to couple the fourth sawtooth capacitor 296 to the IregN current at terminal 282 to discharge the fourth sawtooth capacitor from the Vh reference voltage level.

A HIGH level of the VcmdNb signal on signal line 264 also turns on the fourth NMOS coupling transistor 304 to couple the node 294 and the sawtooth capacitor 296 to the Vstn output terminal 302. A corresponding LOW level of the VcmdN signal on line 266 turns on the third pull-up PMOS transistor 270 to couple the Vh reference voltage at terminal 274 to node 276 to charge the third sawtooth capacitor 278 to the Vh reference voltage level.

Alternately, a HIGH level of the VcmdN signal on signal line 266 turns on the third NMOS pull-down transistor 272 to couple the third sawtooth capacitor 278 to the IregN current at terminal 282 to discharge the third sawtooth capacitor from the Vh voltage level.

A HIGH level of the VcmdN signal on signal line 266 also turns on the third NMOS coupling transistor 300 to couple the node 276 to the Vstn output terminal 302. A corresponding LOW level of the VcmdNb signal on line 264 turns on the fourth pull-up PMOS transistor 290, which couples the Vh voltage at terminal 274 to the fourth sawtooth capacitor 296.

FIG. 9 illustrates that the falling sawtooth signal Vstn at terminal 302 starts falling from the Vh reference voltage level toward the Vl level.

Figure 10:
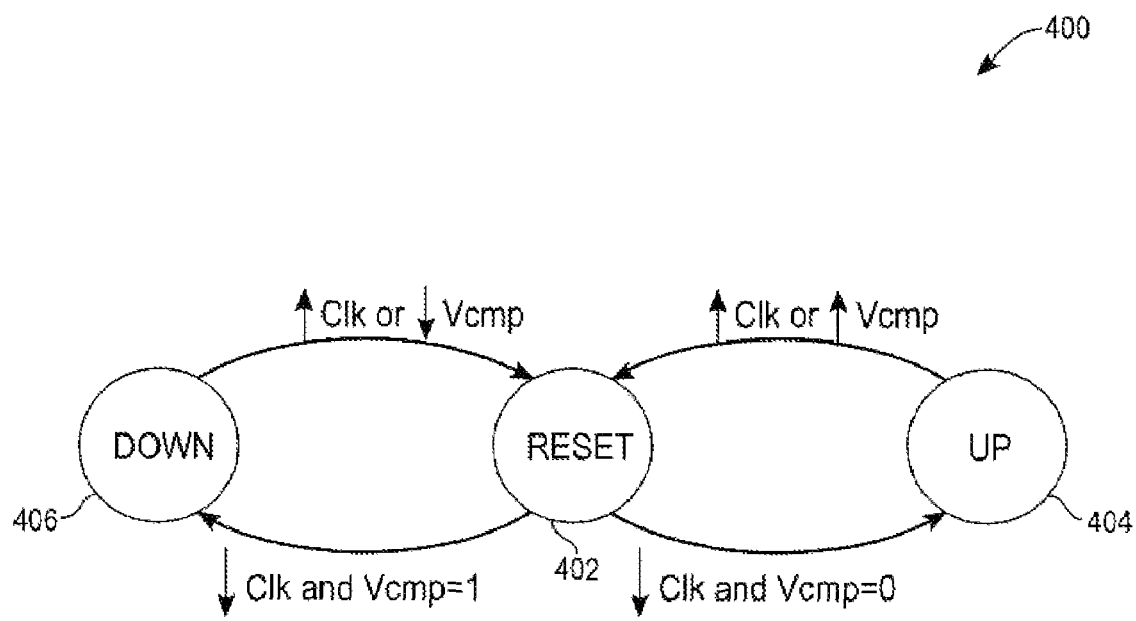
FIG. 10 is a state transition diagram for a phase frequency comparator for the differential amplitude controlled sawtooth generator of FIG. 2.
Figure 11:
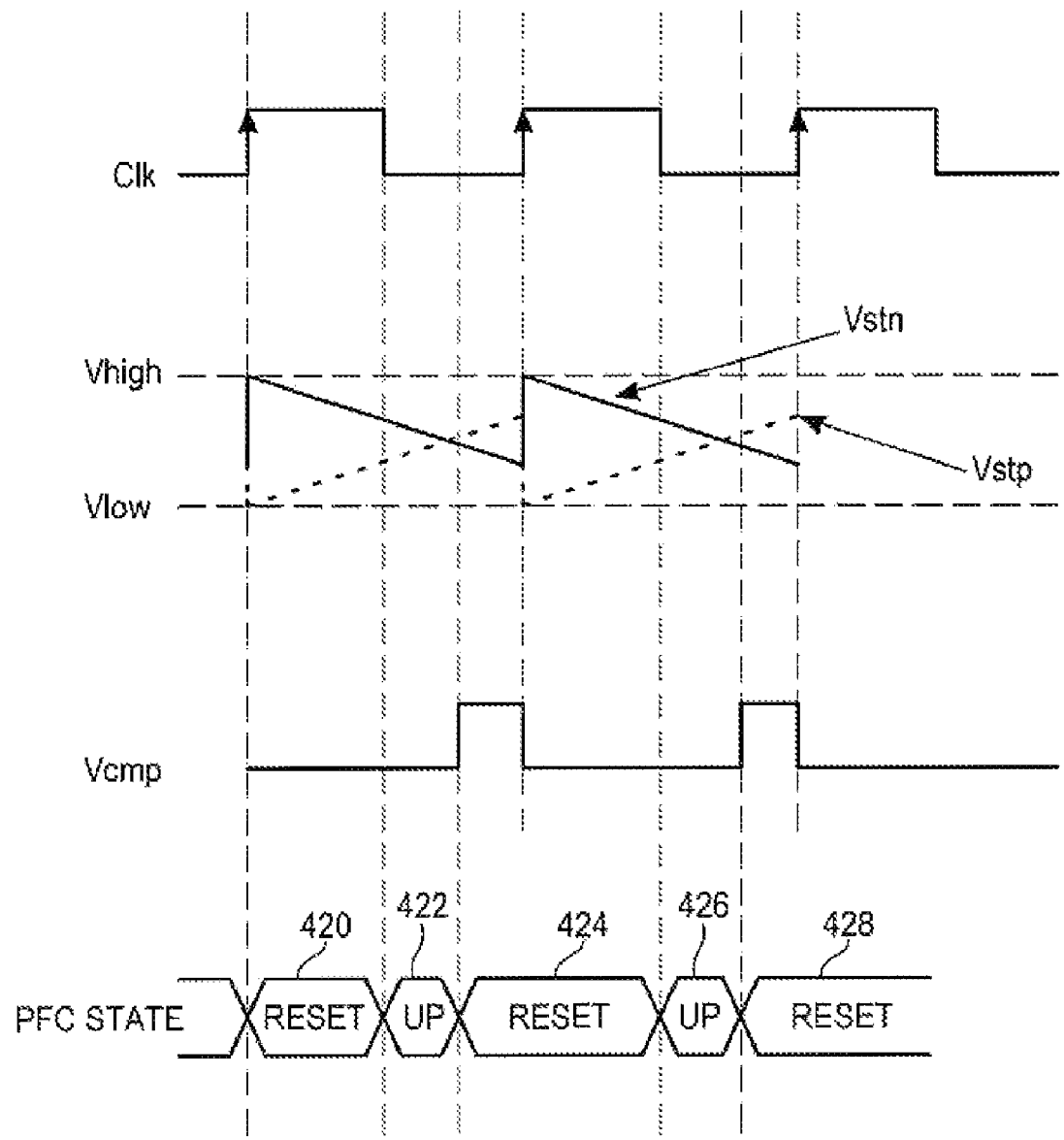
FIG. 11 is a timing diagram illustrating various signals for the phase frequency comparator of FIG. 10.

FIG. 10 is a state transition diagram 400 that describes operation of the phase frequency comparator (PFC) 110 of FIG. 2. FIG. 11 is a timing diagram illustrating various signals for the phase frequency comparator of FIG. 10. The state machine of the PFC 110 has 3 states: a RESET state 402, an UP state 404, and a DOWN state 406. The UP state 404 provides the UP output signal from the PFC 110 to the charge pump circuit 114 to increase the magnitudes of the IregP current and the IregN current. The DOWN state 406 provides the DOWN output signal from the PFC 110 to the charge pump circuit 116 to decrease the magnitudes of the IregP current and the IregN current. The RESET state holds the IregP current and the IregN current at the same value as previously directed.

The phase frequency comparator (PFC) 110 changes from the DOWN state 406 to the RESET state 402 either at the rising edge of the CLK signal or at the falling edge of the output signal Vcmp of the voltage comparator 108. The phase frequency comparator (PFC) 110 changes from the UP state 404 to the RESET state 402 either at the rising edge of the CLK signal or at the rising edge of the output signal Vcmp of the voltage comparator 108. The phase frequency comparator (PFC) 110 changes from the RESET state 402 to the DOWN state 406 at the falling edge of CLK together with Vcmp being at a HIGH, or 1, state. The phase frequency comparator (PFC) 110 changes from the RESET state 402 to the UP state 404 at the falling edge of the CLK signal together with Vcmp being at a LOW, or 0, state.

FIG. 11 illustrates an example of the sawtooth signal generator system 100 initially starting up. The initial magnitude of the output voltage for the positive going sawtooth signal Vstp goes from Vl, or Vlow, and eventually reaches a peak magnitude of Vh, or Vhigh. Similarly, the initial magnitude of the output voltage for the negative going sawtooth signal Vstp goes from Vh, or Vhigh, and eventually reaches a minimum magnitude of Vl, or Vlow. The sawtooth output signals are reset at the positive going transitions of the CLK signal. The output voltage of the comparator 108 goes HIGH when the Vstp output voltage of the positive going sawtooth generator 150 exceeds the Vstn of the negative going sawtooth generator 152.

FIG. 11 also illustrates the PFC state of the phase frequency comparator PFC circuit 110. A first RESET state 420 occurs at the rising edge of the CLK signal. A first UP state 422 occurs when the CLK has a falling edge and VCMP is also LOW, or 0 volts. A second RESET state 424 occurs when Vcmp goes HIGH and remains HIGH until the next falling edge of the CLK signal. Another UP state occurs at a rising edge of the CLK signal. A RESET occurs when Vcmp goes HIGH.

Figure 12:
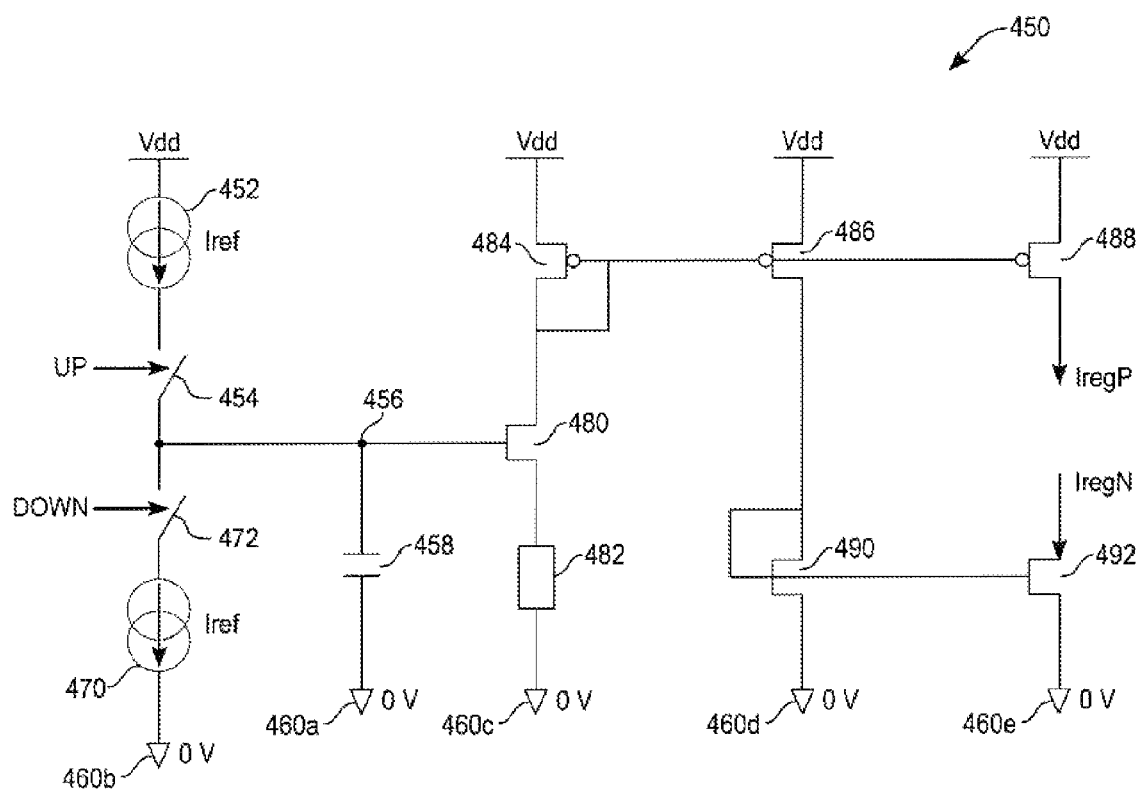
FIG. 12 is a circuit diagram for a charge pump for the differential amplitude controlled sawtooth generator of FIG. 2.

FIG. 12 illustrates a charge pump circuit 450 used in the dual charge pump 114 of FIG. 2. The charge pump circuit 450 provides the IregP feedback current for controlling the magnitude of the positive going sawtooth generator 150. The charge pump circuit 450 also provides the IregN feedback current for controlling the magnitude of the negative going sawtooth generator 152. The currents IregP and IregN both have magnitudes with the same absolute value. IregP is a source current and IregN is a sink current.

The charge pump circuit 450 includes a first constant current source 452 is coupled to a Vdd voltage source to provide an Iref current through an UP switch 454, if closed, to a capacitor reference node 456 to which is coupled a reference capacitor 458 to a ground terminal 460a. The UP switch 454 is closed in response to an UP signal to provide the Iref current to the capacitor reference node 456 to charge the reference capacitor 458 with the Iref constant current. A constant current sink 470 is coupled to a ground terminal 460b and through a DOWN switch 472 to the capacitor reference node 456. The DOWN switch 472 is closed in response to a DOWN signal to draw an Iref sink current from the capacitor reference node 456 to discharge the reference capacitor 458 with the Iref sink current. The amount of charge on the reference capacitor 458 determines the voltage at the reference node 456. The voltage at the capacitor reference node 456 is coupled to a gate terminal of an NMOS transistor 480. A source terminal of the NMOS transistor 480 is coupled through a resistor 482 to a ground terminal 460c to provide a source follower circuit that has the voltage on the source terminal follow the gate terminal voltage. The current through the NMOS transistor 480 passes through a diode-connected PMOS transistor 484 that has a gate terminal and a drain terminal coupled together to a drain terminal of the NMOS transistor 480. A source terminal of the diode-connected PMOS transistor 484 is coupled to the Vdd voltage source. The diode-connected PMOS transistor 484 and a second PMOS transistor 486 have their gate terminals coupled together to form a current mirror circuit. The second PMOS transistor 486 has a source terminal coupled to the Vdd voltage source. A drain terminal of the second PMOS transistor 486 is coupled to a drain terminal of a diode-connected NMOS transistor 490 that has a drain and a gate coupled together and that has a drain coupled to a ground terminal 460d. The current through the second PMOS transistor 486 and the diode-connected NMOS transistor 490 are the same. A PMOS current source transistor 488 has a source coupled to the Vdd voltage source. A gate of the PMOS current source transistor 488 is coupled to the gate of the gates of the second PMOS transistor 486 and the diode-connected PMOS transistor 484 to provide a current mirror circuit. The PMOS current source transistor 488 provides a source current IregP that follows the voltage at the capacitor reference node 456.

A source of a current sink NMOS transistor 492 is coupled to a ground terminal 460e. A gate of the current sink transistor 492 is coupled to the gate and drain terminals of the diode-connected NMOS transistor 490 to provide a current mirror circuit. The NMOS current sink transistor 492 provides a sink current IregN that also follows the voltage at the capacitor reference node 456. The source current IregP and the sink current IregN have the same absolute values.

During an "UP" sequence (i.e. UP=1 and DOWN=O), the reference capacitor 458 is charged by the Iref current source 452. This increases the voltage across the reference capacitor 458. The NMOS transistor 480 and the resistor 482 are used as a voltage-to-current converter. As the voltage on the reference capacitor 458 increases, the current through the NMOS transistor 480 increases and is mirrored through PMOS transistors 484, 488 to provide an increased source current IregP. The increased current through the NMOS transistor 480 is also mirrored to the PMOS transistor 486 and through the NMOS transistors 490, 492 to provide an increased sink current IregN.

During a "DOWN" sequence (i.e. UP=0 and DOWN=1), the reference capacitor 458 is discharged through by the Iref current sink 470 to decrease the voltage across the reference capacitor 458. As voltage on the reference capacitor 458 decreases, the current through the NMOS transistor 480 decreases. The decreased current is mirrored through the PMOS transistors 484, 488 to generate the decreased source current IregP. Similarly a decreased sink current IregN is provided.

When the UP and DOWN signal are not active to close either the UP switch 454 or the DOWN switch 472, the voltage stored on the reference capacitor 458 maintains the regulated output currents IregP and IregN for the feedback loops at unchanged levels. The regulation currents IregP and IregN are used in their respective feedback loops to adjust the amplitude of their respective sawtooth generators. This provides good accuracy for the magnitudes of the sawtooth voltages and reduces the effects of variations in resistor and capacitor values caused by fabrication process variations. The dual sawtooth generator system 100 is based on generation of 2 matched sawtooth signals that are matched in their absolute magnitudes. The starting voltage for the positive going sawtooth signal is the Vl reference voltage. The starting voltage for the negative going sawtooth signal is the Vh reference voltage. The positive going sawtooth signal Vstp is controlled by the feedback current IregP and starts from the Vl reference value. The negative going sawtooth signal Vstn is controlled by the feedback current IregN and starts from the Vh reference value. The magnitudes of the Vstp and the Vstn signals are controlled by the two current regulation loops provided by the dual charge pump circuit 114. The comparator 108 compares the magnitude of the Vstp and Vstn signals. The phase frequency comparator 110 compares the output Vcmp of the comparator 108 with the falling edge of the reference CLK signal. During each CLK period, the phase frequency comparator 110 controls the charge pump circuit 114 that produces the IregP and IregN current feedback signals to obtain a desired sawtooth magnitude. The system is regulated when the feedback currents IregP and IregN are stable. For very accurate system requirements, final adjustments of magnitude are obtained by varying the duty cycle of the reference CLK signal.

Figure 13:
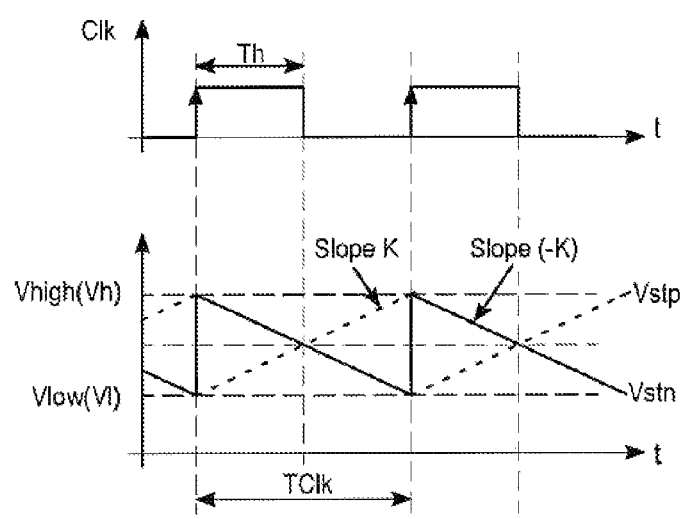
FIG. 13 is a timing diagram showing a CLK signal with a duty cycle Th and a period TClk.

With reference to FIG. 13, the relationship between the duty cycle of the clock CLK signal and the magnitude of the sawtooth signals Vstp and Vstn is described by the relationship: DC=Th/TClk, where DC is the duty cycle, Th is the time that the CLK signal is HIGH, and TClk is the period of the Clk signal. Vstp is a linear function of time, which can be written: $Vstp(t)=K \times t+Vl$, where t is the time variable, and K is the slope of the sawtooth signal, Vl is the low voltage reference voltage, and Vh is the high voltage reference voltage.

With reference to FIG. 13:

$$K=\{[(Vh+Vl)/2]-Vl\}/Th; \text{ and}$$

$$K=[(Vh-Vl)/2]/Th.$$

Thus, $Vstp(t)=\{[(Vh-Vl)/2]/Th\} \times t+Vl$.

Expressing Vstp(t) as a function of the duty cycle DC and with Th=DC×TClk), $$Vstp(t)=\{[(Vh-Vl)/2]/(DC*Tclk)\} \times Tclk+Vl.$$

The final expression which links the magnitude (VM) of Vstp at time Tclk is:

$$Vstp(Tclk)=\{([(Vh-Vl)/2]/(DC \times Tclk)\} \times Tclk+Vl$$

$$VM=Vstp(Tclk)-Vl=(Vh-Vl)/(2 \times DC)$$

A first example is for Vl equal to 1.1 volts, Vh equal to 1.3 volts, and DC equal to 0.5. In this case, VM equals (0.2/1) which equals 0.2 Volts.

A second example is for Vl equal to 1.1 volts, Vh equal to 1.3 volts, and DC equal to 0.4. In this case, VM equals 0.2/(2×0.4) which equals 0.25 Volts.

This illustrates that the sawtooth magnitude is changed by varying the duty cycle of the clock CLK signal.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A dual differential sawtooth signal generator, comprising:
    a first sawtooth voltage generator having a first charge capacitor and configured to provide a positive going sawtooth output signal;
    a second sawtooth voltage generator having a first discharge capacitor and configured to provide a negative going sawtooth output signal;
    a comparator that is configured to compare the positive going sawtooth output signal with the negative going sawtooth output signal and that is configured to provide a comparator output signal;
    a phase frequency comparator that, in response to the comparator output signal, is configured to provide signals to control a dual charge pump that is configured to provide a feedback control source current to the positive going sawtooth generator for controlling the magnitude of the positive going sawtooth output signal and that is also configured to provide a feedback control sink current to the negative going sawtooth generator for controlling the magnitude of the negative going sawtooth output signal; and
    wherein the magnitudes of the feedback control source current and the feedback control sink current have the same absolute value.

2. The dual differential sawtooth signal generator of claim 1 wherein the first charge capacitor is configured to be charged with the feedback control source current from a low voltage reference voltage level; and
    wherein the first discharge capacitor is configured to be discharged with the feedback control sink current from a high voltage reference voltage level.

3. The dual differential sawtooth signal generator of claim 1 wherein the phase frequency comparator is configured to provide control signals to increase or decrease the magnitude of the feedback control source current signal and the feedback control sink current.

4. The dual differential sawtooth signal generator of claim 1 wherein the high voltage reference voltage level and the low voltage reference voltage level are derived from a bandgap voltage reference source.

5. The dual differential sawtooth signal generator of claim 1 wherein the first sawtooth voltage generator includes a second charge capacitor and wherein the second sawtooth voltage generator includes a second discharge capacitor such that the first and second charge capacitors and the first and second discharge capacitors are configured to be respectively alternately charged and discharged to alternatively respectively provide the first positive going sawtooth output signal and the second negative going sawtooth output signal.

6. The dual differential sawtooth signal generator of claim 1 wherein the phase frequency comparator includes a state machine that is configured to receive the comparator output signal and a clock signal and that in response thereto is configured to alternatively provide an UP output signal and a DOWN signal, such that the UP output signal increases the first variable feedback control source current and the second variable feedback control sink current, and such that the DOWN output signal decreases the first feedback control source current and the second variable feedback control sink current.

7. The dual differential sawtooth generator of claim 6, wherein:
    the state machine is configured to change from the DOWN state to a RESET state either at the rising edge of the clock signal or at the falling edge of the comparator output signal of the voltage comparator;
    the state machine is configured to change from the UP state to the RESET state either at the rising edge of the clock signal or at the rising edge of the comparator output signal of the voltage comparator;
    the state machine is configured to change from the RESET state to the DOWN state at the falling edge of the clock signal together with comparator output signal being at a HIGH state; and
    the state machine is configured to change from the RESET state to the UP state at the falling edge of CLK together with the comparator output signal being at a LOW state.

8. The dual differential sawtooth generator of claim 7 wherein the amplitudes of the positive going and the negative going sawtooth signals are adjusted by changing the duty cycle of the clock signal.

9. The dual differential sawtooth generator of claim 1 wherein the dual charge pump circuit includes:
- a constant current source that is coupled through a first switch to a reference capacitor node that has a reference capacitor coupled between it and a ground terminal, such that the first switch is configured to be closed in response to an UP signal to provide a reference charging current to the reference capacitor;
- a constant current sink that is coupled through a second switch to the capacitor reference node, such that the second switch is configured to be closed in response to a DOWN signal to draw a reference discharging current from the reference capacitor; and
- a current source that provides the feedback source current proportional to a voltage on the reference capacitor and a current sink that provides the feedback sink current proportional to the voltage on the reference capacitor.

10. The dual differential sawtooth generator of claim 8 including a circuit that is configured to convert the voltage at the reference capacitor to a current that is mirrored to both the feedback source current and the feedback sink current such that the feedback source current and the feedback sink current have the same absolute value.

11. A dual output differential sawtooth generator, comprising:
- a dual-capacitor positive going sawtooth voltage generator circuit is configured to provide a positive going sawtooth output signal;
- a dual-capacitor negative going sawtooth voltage generator circuit is configured to provide a negative going sawtooth output signal;
- a comparator circuit that is configured to compare the positive going sawtooth output signal with the negative going sawtooth output signal to provide a comparator output signal;
- a phase frequency comparator that, in response to the comparator output signal is configured to provide signals to control a dual charge pump that provides a feedback source current to the positive going sawtooth generator for controlling the magnitude of the positive going sawtooth output signal and that also is configured to provide a feedback sink current to the negative going sawtooth generator for controlling the magnitude of the negative going sawtooth output signal; and
- wherein the feedback source current and the feedback sink current from the dual charge pump have the same absolute value.

12. The dual output differential sawtooth generator of claim 11 wherein the dual-capacitor positive going sawtooth voltage generator circuit includes a first positive going sawtooth capacitor and a second positive going sawtooth capacitor that are alternately charged with the feedback source current; and
- wherein the dual-capacitor negative going sawtooth voltage generator circuit includes a first negative going sawtooth capacitor and a second negative going sawtooth capacitor that are alternately discharged with the feedback sink current.

13. The dual output differential sawtooth generator of claim 12 wherein the dual-capacitor positive going sawtooth voltage generator circuit is configured to have a first positive going sawtooth command signal and a second complementary positive going sawtooth command signal that are alternatively coupled to one of the first and second positive going sawtooth capacitors and to couple the other of the first and second positive going sawtooth capacitors to a low voltage reference voltage so that each of the positive going sawtooth capacitors alternately provides a positive going sawtooth output signal that starts at the low voltage reference voltage; and
- wherein the dual-capacitor negative going sawtooth voltage generator circuit is configured to have a first negative going sawtooth command signal and a second complementary negative going sawtooth command signal that are alternatively coupled to one of the first and second negative going sawtooth capacitors and to couple the other of the first and second negatively going sawtooth capacitors to a high voltage reference voltage so that each of the negative going sawtooth capacitors alternately provides a negative going sawtooth output signal that starts at the high voltage reference voltage.

14. The dual output differential sawtooth generator of claim 13 wherein the high and low reference voltage levels are derived from a bandgap voltage reference and wherein each positive going sawtooth output signal is reset to the low reference voltage level and wherein each negative going sawtooth output signal is reset to the high reference voltage level.

15. The dual output differential sawtooth generator of claim 14 where each of the dual-capacitor sawtooth voltage generator circuits includes:
- a first CMOS inverter coupled between a node for the feedback current from the charge pump circuit and a node for the low voltage reference voltage;
- an output terminal of the first CMOS inverter coupled to one terminal of the first positive going sawtooth capacitor with another terminal of the first positive sawtooth capacitor coupled to a ground terminal;
- an input terminal of the first CMOS inverter coupled to receive the first sawtooth command signal;
- a second CMOS inverter also coupled between the node for the feedback, current from the charge pump circuit and the node for the low voltage reference voltage;
- an output terminal of the second CMOS inverter coupled to one terminal of a second sawtooth capacitor with another terminal of the second sawtooth capacitor coupled to a ground terminal;
- an input terminal of the second CMOS inverter configured to receive the second complementary sawtooth command signal;
- a first NMOS coupling transistor coupled between one terminal of the first sawtooth capacitor and a sawtooth signal output node, wherein a gate terminal of the first NMOS coupling transistor is configured to receive the first sawtooth command signal;
- a second NMOS coupling transistor coupled between one terminal of the second complementary sawtooth command signal and the sawtooth signal output node, wherein a gate terminal of the second NMOS coupling transistor is configured to receive the first sawtooth command signal signal; and
- wherein the sawtooth signal generator is configured to alternately direct the feedback current signal to charge one of the sawtooth capacitors while the other one of the sawtooth capacitors is discharged to the low voltage reference voltage level.

16. The dual output differential sawtooth generator of claim 11 wherein the phase frequency comparator is a state machine that is configured to provide the UP signal in an UP state to provide an increase in the feedback current signal, that is configured to provide the DOWN signal in the DOWN state to provide a decrease in the feedback current signal, and that is configured to provide a RESET state in which neither an UP signal or a DOWN signal is provided.

17. The dual differential sawtooth generator of claim 16, wherein:
   the state machine is configured to change from the DOWN state to the RESET state either at the rising edge of the clock signal or at the falling edge of the comparator output signal of the voltage comparator;
   the state machine is configured to change from the UP state to the RESET state either at the rising edge of the clock signal or at the rising edge of the comparator output signal of the voltage comparator;
   the state machine is configured to change from the RESET state to the DOWN state at the falling edge of the clock signal together with comparator output signal being at a HIGH state; and
   the state machine is configured to change from the RESET state to the UP state at the falling edge of CLK together with the comparator output signal being at a LOW state.

18. The dual differential sawtooth generator of claim 16 wherein the positive going charge pump circuit includes:
   a constant current source that is coupled through a first switch to a reference capacitor node that has a reference capacitor coupled between it and a ground terminal, such that the first switch is configured to be closed in response to an UP signal to provide a reference charging current to the reference capacitor; and
   a constant current sink that is coupled through a second switch to the capacitor reference node, such that the second switch is configured to be closed in response to a DOWN signal to draw an a reference discharging current from the reference capacitor to discharge the reference capacitor.

19. The dual output differential sawtooth generator of claim 18, including a voltage to current circuit that is configured to convert the voltage across the reference capacitor to a reference current that is current mirrored to provide the feedback control source current signal and the feedback control sink current signal.

20. A method of generating dual differential sawtooth signals, the method comprising the steps of:
   controlling the amplitude of a positive going sawtooth output signal by charging a charge capacitor in a positive going sawtooth voltage generator with a variable feedback control source current;
   controlling the amplitude of a negative going sawtooth output signal by charging a charge capacitor in a negative going sawtooth voltage generator with a variable feedback control sink current;
   comparing the first positive going sawtooth output signal with the second negative going sawtooth output signal to provide a comparator output signal; and
   controlling with the comparator output signal a dual charge pump that provides a feedback source current to the positive going sawtooth generator for controlling a magnitude of the positive going sawtooth output signal and that also provides a feedback sink current to the negative going sawtooth generator for controlling the magnitude of the negative going sawtooth output signal such that the feedback source current and the feedback sink current from the dual charge pump have the same absolute value.

21. The method of claim 20 including the step of the phase frequency comparator providing control signals for increasing, maintaining, or decreasing the feedback source current and the feedback sink current.

22. The method of claim 20 including using a state machine to provide control signals for increasing, maintaining, or decreasing the feedback source current and the feedback sink current; and
   the state machine receiving the comparator output signal and a clock signal and providing the control signals for controlling the feedback source current and the feedback sink current.

23. The method of claim 20 including the step of adjusting the amplitude of the positive going and the negative going sawtooth signals by changing the duty cycle of the clock signal.

* * * * *

UNITED STATES PATENT AND TRADEMARK OFFICE
CERTIFICATE OF CORRECTION

PATENT NO.         : 7,336,110 B1
APPLICATION NO.    : 11/624139
DATED              : February 26, 2008
INVENTOR(S)        : Payrard et al.

Page 1 of 1

It is certified that error appears in the above-identified patent and that said Letters Patent is hereby corrected as shown below:

On the Title Page, Item (75), in "Inventors", line 2, delete "les" and insert -- Les --, therefor.

In column 2, line 34, delete "sawtobth" and insert -- sawtooth --, therefor.

In column 4, line 31, after "generator" insert -- . --.

In column 8, line 5, after "and" delete ",".

In column 14, line 59, in Claim 15, after "command signal" delete "signal".

In column 15, line 35, in Claim 18, after "draw" delete "an".

Signed and Sealed this

Fourteenth Day of October, 2008

JON W. DUDAS
*Director of the United States Patent and Trademark Office*